US012751017B2

(12) United States Patent
Redaelli

(10) Patent No.: US 12,751,017 B2
(45) Date of Patent: Sep. 29, 2026

(54) MEMORY CIRCUIT COMPRISING ELECTRONIC CELLS WITH OVONIC THRESHOLD SWITCHING LAYERS AND A CONTROL CIRCUIT

(71) Applicant: STMicroelectronics International N.V., Geneva (CH)

(72) Inventor: Andrea Redaelli, Milan (IT)

(73) Assignee: STMicroelectronics International N.V., Geneva (CH)

( * ) Notice: Subject to any disclaimer, the term of this patent is extended or adjusted under 35 U.S.C. 154(b) by 129 days.

(21) Appl. No.: 18/738,675

(22) Filed: Jun. 10, 2024

(65) Prior Publication Data

US 2024/0422992 A1 Dec. 19, 2024

(30) Foreign Application Priority Data

Jun. 19, 2023 (FR) ....................................... 2306306

(51) Int. Cl.
*H10B 63/00* (2023.01)
*G11C 13/00* (2006.01)
*H10N 70/00* (2023.01)

(52) U.S. Cl.
CPC ......... *H10B 63/24* (2023.02); *G11C 13/0026* (2013.01); *G11C 13/0028* (2013.01); *H10B 63/30* (2023.02); *H10N 70/841* (2023.02); *H10N 70/882* (2023.02); *G11C 2213/79* (2013.01)

(58) Field of Classification Search
CPC .... H10B 63/24; H10B 63/30; G11C 13/0026; G11C 13/0028; G11C 2213/79; G11C 2213/15; G11C 2213/77; G11C 13/0069; G11C 2013/005; G11C 2013/0052; G11C 2013/009; G11C 2013/0092; G11C 13/003; G11C 13/004; G11C 13/0002; G11C 16/06; G11C 11/40; H10N 70/841; H10N 70/882
See application file for complete search history.

(56) References Cited

U.S. PATENT DOCUMENTS

2012/0025164 A1 2/2012 Deweerd et al.
2017/0117328 A1 4/2017 Terai
2017/0243922 A1 8/2017 Eun
2019/0013357 A1 1/2019 Kim et al.
(Continued)

FOREIGN PATENT DOCUMENTS

EP 4036997 A1 8/2022

OTHER PUBLICATIONS

INPI Search Report and Written Opinion for priority application, FR Appl. No. 2306306, report dated Feb. 2, 2024, 10 pgs.

*Primary Examiner* — Jerome Leboeuf
(74) *Attorney, Agent, or Firm* — Crowe & Dunlevy LLC

(57) ABSTRACT

Each electronic cell of a memory array includes an integrated stack having, successively, a first electrode, an intermediate layer formed by an ovonic threshold switching layer, and a resistor connected to the intermediate layer. A control circuit is connected to the electronic cell. The control circuit is structured and configured to apply, between the first electrode and the resistor, a first voltage impulse of a first polarity to set a first logic state of the electronic cell and a second voltage impulse of a second polarity, opposite the first polarity, to set a second logic state of the electronic cell.

19 Claims, 4 Drawing Sheets

(56) References Cited

U.S. PATENT DOCUMENTS

| | | | | |
|---|---|---|---|---|
| 2019/0035851 | A1 | 1/2019 | Tortorelli et al. | |
| 2020/0052036 | A1 | 2/2020 | Ikarashi et al. | |
| 2020/0075853 | A1 | 3/2020 | Yu et al. | |
| 2020/0098825 | A1 | 3/2020 | Boivin | |
| 2020/0202928 | A1 | 6/2020 | Pio | |
| 2020/0303462 | A1* | 9/2020 | Pellizzer | H10N 70/231 |
| 2020/0395410 | A1 | 12/2020 | Grobis et al. | |
| 2021/0035629 | A1 | 2/2021 | Kim | |
| 2022/0005869 | A1* | 1/2022 | Kim | G11C 7/12 |
| 2022/0238603 | A1 | 7/2022 | Cappelletti et al. | |
| 2023/0386573 | A1* | 11/2023 | Ambrosi | G11C 13/0004 |
| 2024/0046986 | A1* | 2/2024 | Choi | H10B 63/10 |
| 2024/0324246 | A1* | 9/2024 | Yang | G11C 13/0004 |

* cited by examiner

MEMORY CIRCUIT COMPRISING ELECTRONIC CELLS WITH OVONIC THRESHOLD SWITCHING LAYERS AND A CONTROL CIRCUIT

PRIORITY CLAIM

This application claims the priority benefit of French Application for Patent No. 2306306, filed on Jun. 19, 2023, the content of which is hereby incorporated by reference in its entirety to the maximum extent allowable by law.

TECHNICAL FIELD

The present disclosure relates generally to electronic devices and more precisely to integrated electronic cells arranged in arrays. The present disclosure specifically concerns electronic devices comprising an ovonic threshold switching (OTS) material.

BACKGROUND

Among the chalcogenide materials, two categories are currently studied for being used in electronic devices and more particularly in the manufacturing of switching devices and memories. In particular, a distinction is made between ovonic threshold switching (OTS) materials and phase change (PC) materials. Both materials can be used in thin film in the electronic integrated devices.

An ovonic threshold switching material toggles between an "on" and "off" state depending on the amount of voltage potential applied across the electronic cell. The state of the ovonic threshold switch changes when a voltage through the ovonic threshold switch exceeds a threshold voltage. Once the threshold voltage is reached, the "on" state is triggered and the ovonic threshold switch is in a substantially conductive state. If the current or voltage potential drops below the threshold value, the ovonic threshold switch returns to the "off" state.

A phase-change material can switch, under the effect of heat, between a crystalline phase and an amorphous phase. Since the electric resistance of an amorphous material is significantly greater than the electric resistance of a crystalline material, such a phenomenon may be useful to define two memory states, differentiated by the resistance measured through the phase-change material. The most common phase-change materials used in phase change memories are Germanium-Antimony-Tellurium (GST) based.

FIGS. 1A and 1B illustrate two simplified cross-section views of an example of a known memory cell as illustrated in United States Patent Application Publication No. 2022/0238603 (corresponding to French Application for U.S. Pat. No. 2,100,747), the disclosure of which is incorporated by reference.

The electronic cell 100 comprises a resistor 102 or resistive element having a fixed resistance value, a first electrode 105 also called first electrode and an additional layer 106. The electronic cell 100 further comprises an intermediate layer 104' comprising an ovonic threshold switch (OTS) layer 104, a memory layer 108 and a barrier layer 110. The intermediate layer 104' is, for example, located between the resistor 102 and the first electrode 105, with the OTS layer 104 for example in contact with the resistor 102. For example, the additional layer 106 is connected to the first electrode 105. The memory layer 108 is for example located above the OTS layer 104 and between the OTS layer 104 and the first electrode 105. The barrier layer 110 is arranged between the memory layer 108 and the OTS layer 104.

When the voltage applied to the electronic cell is higher than a threshold voltage of the OTS layer 104, an electrical current may flow through the OTS layer 104 and the memory layer 108 in the electronic cell 100 and may result in changing the resistivity of the layer 108. This change may alter the memory state of the layer 108, thus altering the electrical characteristic of the electronic cell 100.

The high resistive state may be associated with a "reset" state or a logic "0" value, while a low resistive state may be associated with a "set" state, or a logic "1" value.

There is a need for improvement of existing integrated electronic cells containing an Ovonic Threshold Switch.

There is a need in the art to address the problem of making an electronic cell to be used in a (memory) array having a simplified structure, but at the same time able to efficiently and/or properly working and/or having the desirable overall properties.

SUMMARY

To address the above-noted problem, a memory circuit according to one or more of the following embodiments is presented.

An embodiment provides a memory circuit comprising: a memory array comprising a plurality of electronic cells, wherein at least one electronic cell comprises an integrated stack having successively: i) a first electrode; ii) an intermediate layer comprising an ovonic threshold switching layer; and iii) a resistor connected to the intermediate layer, and a control circuit connected to the at least one electronic cell, wherein the control circuit is structured and configured to apply, between the first electrode and the resistor, a first voltage impulse of a first polarity to set a first logic state of the electronic cell and a second voltage impulse of a second polarity, opposite the first polarity, to set a second logic state of the electronic cell.

According to an embodiment, the ovonic threshold switching layer is made of a chalcogenide material.

According to an embodiment, the at least one electronic cell comprises only the intermediate layer between the first electrode and the resistor, and wherein the intermediate layer comprises only the ovonic threshold switching layer.

According to an embodiment, the ovonic threshold switching layer has a thickness between 15 nm and 50 nm.

According to an embodiment, the control circuit comprises a plurality of bit lines and a plurality of word lines, and the at least one electronic cell is connected to a respective bit line by its resistor, and to a respective word line by its first electrode.

According to an embodiment, the integrated stack further comprises a transistor connected to the resistor on opposite side with respect to the intermediate layer.

According to an embodiment, the transistor is a MOSFET transistor.

According to an embodiment, the transistor is a FinFET transistor.

According to an embodiment, the ovonic threshold switching layer has a thickness between 5 nm and 10 nm.

According to an embodiment, the control circuit comprises a plurality of bit lines and a plurality of word lines, and the at least one electronic cell is connected to a respective word line by its transistor and to a respective bit line by its first electrode.

According to an embodiment, the transistor comprises a drain and a gate and it is connected by its drain to the resistor, and by its gate to the respective word line.

According to an embodiment, the control circuit comprises for each pair of bit line and word line a respective inverter comprising a respective p-MOS transistor and a respective n-MOS transistor.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1A:
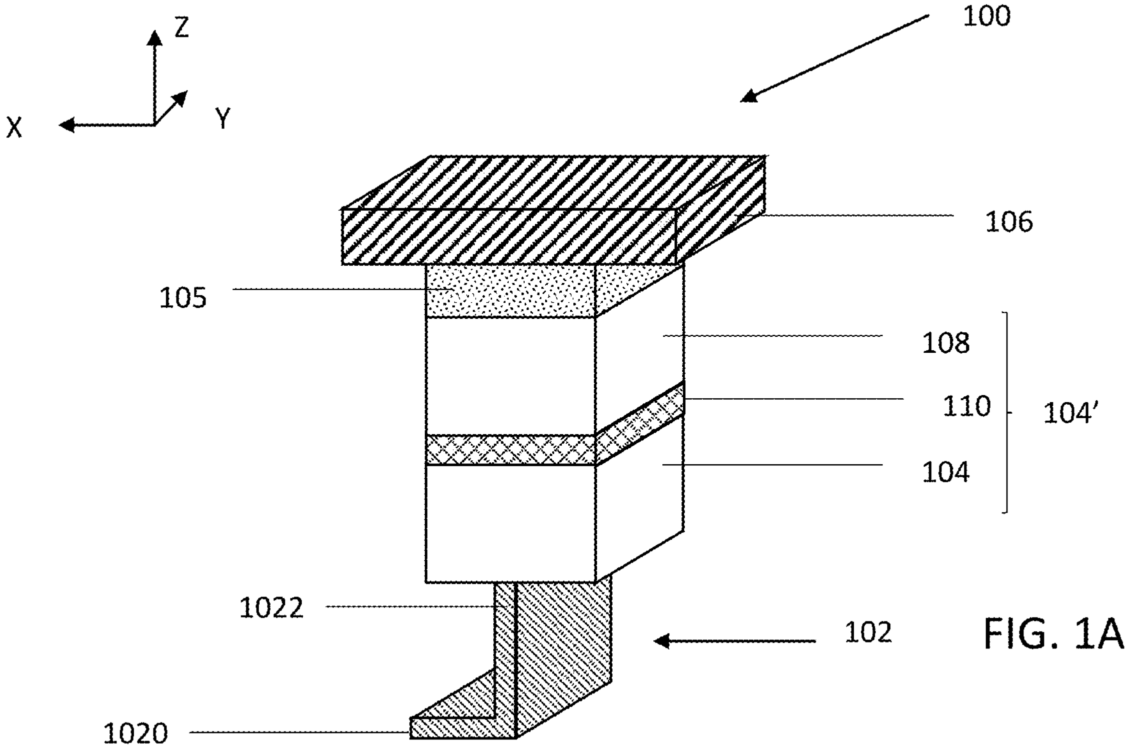
FIGS. 1A and 1B illustrate two simplified cross-section views of a known electronic cell.
Figure 1B:
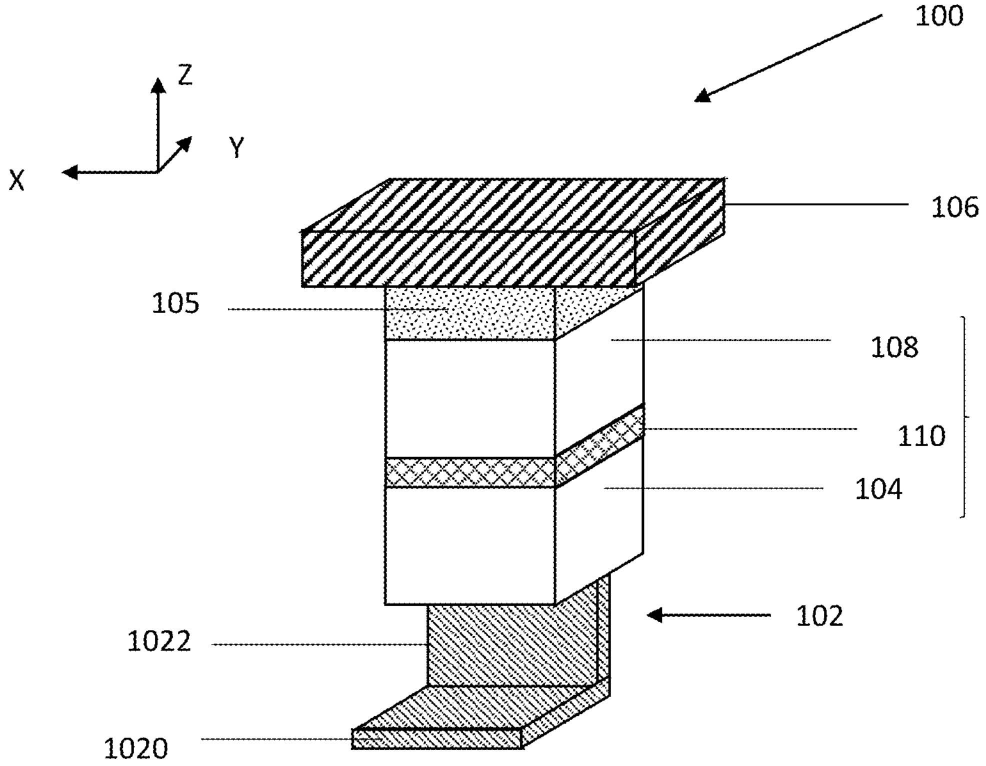

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, electric connections between electronic cells organized in array, and selection circuits have not been detailed, the disclosed embodiments being compatible with existing switch arrays and the corresponding control circuitry.

Unless indicated otherwise, when reference is made to two elements connected together, this signifies a direct connection without any intermediate elements other than conductors, and when reference is made to two elements coupled together, this signifies that these two elements can be connected, or they can be coupled via one or more other elements.

In the following disclosure, unless indicated otherwise, when reference is made to absolute positional qualifiers, such as the terms “front”, “back”, “top”, “bottom”, “left”, “right”, etc., or to relative positional qualifiers, such as the terms “above”, “below”, “higher”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within +/−10%, and preferably within +/−5%.

In the context of the present description, “logic state” means either a “set” state of the intermediate layer (or the ovonic threshold switching layer) characterized by a first threshold voltage, or a “reset” state of the intermediate layer (or the ovonic threshold switching layer) characterized by a second threshold voltage. Typically, the intermediate layer (or the ovonic threshold switching layer) in the set state is conductive for voltage values between the first and second threshold voltage, while the intermediate layer (or the ovonic threshold switching layer) in the reset state is resistive for voltage values between the first and second threshold.

In the context of the present description, “conductive” element means that such element (e.g., the intermediate layer or the ovonic threshold switching layer), by applying an electric field intensity greater than or equal to 2 MV/cm and less than or equal to 4 MV/cm (the voltage difference being applied along the thickness direction of the element, typically in the order of the nanometers), allows a passage of a current less than or equal to 5 mA, preferably less than or equal to 2 mA (the current being limited by the presence of the resistor, typically having a resistance value in the order 5-10 kΩ).

In the context of the present description, “resistive” (or non-conductive) element means that such element (e.g., the intermediate layer or the ovonic threshold switching layer), by applying an electric field intensity greater than 4 MV/cm and less than or equal to 10 MV/cm, allows a passage of a current less than or equal to 50 μA, preferably less than or equal to 25 μA, more preferably less than or equal to 10 μA.

Advantageously, the control circuit allows to implement a dual polarity operation of the intermediate layer. In particular, it has been experimentally verified (through a large test campaign) that in this way it is possible to exploit the intermediate layer comprising the OTS layer both as a memory element (i.e., an element able to be programmed in a logic state and able to retain the imparted logic state) and as selector leakage element (i.e., an element able to allow/impede the passage of current through the electronic cell).

Figure 2A:
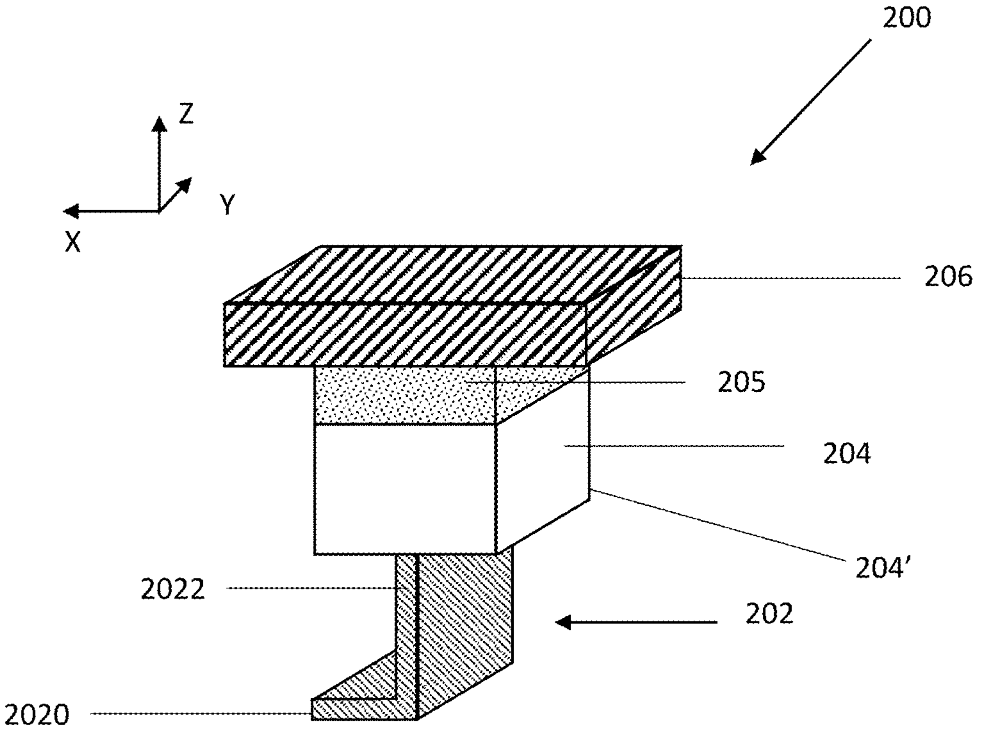
FIGS. 2A and 2B illustrate two simplified cross-section views of an electronic cell according to a first embodiment.
Figure 2B:
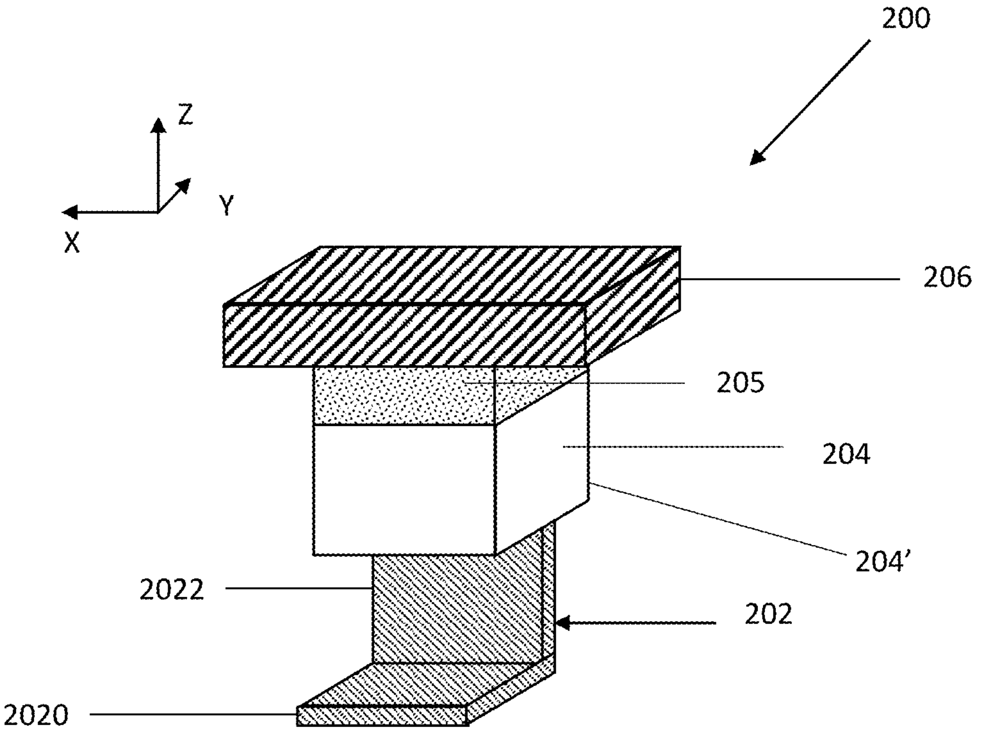

FIGS. 2A and 2B show an electronic cell 200 according to a first embodiment. It is noted that FIGS. 2A and 2B represent only one electronic cell 200, but typically the electronic cell is part of a memory array including a large number of integrated electronic cells manufactured using thin film layers of chalcogenide materials, semiconductive materials, resistive materials, insulating materials, conductive materials, etc.

For sake of simplification, reference is made to layers to designate the corresponding elements of a stack forming the electronic cell. It should however be understood that the corresponding layers correspond, in practice, to thin films deposited and etched to form individual switching elements separated by insulating trenches and arranged, for example in arrays. The terminals or electrodes of each electronic cell may be interconnected, for example in lines and in columns, by corresponding layers of the stack.

The electronic cell 200 comprises a resistor 202, exemplarily having a fixed resistance value (e.g., independent from the crystalline state).

The electronic cell 200 comprises a first electrode 205.

The electronic cell 200 comprises an intermediate layer 204', exemplarily interposed in direct contact between the resistor 202 and the first electrode 205.

Exemplarily the intermediate layer 204' comprises only an ovonic threshold switch (OTS) layer 204. In this way the structure of the electronic cell is simplified, with advantages in terms of costs and/or production times, and/or the encumbrance of the electronic cell is reduced with consequent reduction of the overall dimension of the memory circuit (i.e., spare of silicon area with related costs).

For example, the electronic cell 200 further comprises an additional layer 206 connected to the first electrode 205 on opposite side with respect to the OTS layer 204 (in other words the first electrode is interposed between the additional layer and the intermediate layer). Preferably the additional layer is made of a material with a conductivity greater than or equal to 20 S/μm, more preferably greater than or equal to 40 S/μm.

Exemplarily in FIGS. 2A and 2B, the first electrode 205 forms an electrode of the electronic cell 200 while the resistor 202 forms another electrode of the electronic cell 200.

The resistor 202 has, for example, an L-shaped cross-section, i.e., the resistor 202 has a horizontal portion 2020 and a vertical portion 2022. The resistor 202 is, for example, surrounded by an insulating layer, not shown. The thickness of this insulating layer is such that the upper surface of the vertical portion 2022 of the resistor 202 is coplanar with the upper surface of the insulating layer. Although illustrated with an L-shaped cross-section, the shape of the resistor 202 can easily be adapted within a squared-shaped cross-section or any other shapes (not shown). The resistor 202 is connected to the OTS layer 204, for example in contact with the OTS layer 204.

The electronic cells of FIGS. 2A, 2B, and 4 to 6 are shown in space following an orthogonal spatial system XYZ in which the axis Z is orthogonal to the top face of the additional layer 206 of the electronic cell.

In the embodiment of FIGS. 2A and 2B, the top additional layer 206 extends horizontally along the direction X. In the example of FIG. 2A, the vertical portion 2022 of the resistor 202 is preferably centered with respect to the electronic cell 200 and extends vertically along the direction Y. In the example of FIG. 2B, the vertical portion 2022 of the resistor 202 is preferably centered with respect to the electronic cell 200 and extends vertically along the direction X.

The difference between the views shown in FIGS. 2A and 2B is therefore the orientation of the L-shaped resistor. The view in FIG. 2A is referred to as a "self-aligned wall" cell architecture, in which the resistor 202 width is equal to the additional layer 206 width. In the view of FIG. 2A, the resistor 202 and the additional layer 206 are, for example, formed using the same masking layer and in the same direction.

The view of FIG. 2B corresponds to a use of the "self-aligned wall technology" in a different way, in which the width of resistor 202 is not equal to the width of the additional layer 206. In the view of FIG. 2B, the resistor 202, the OTS layer 204 and the first electrode 205 are, for example, formed using the same masking layer as the one used to form the additional layer 206 but oriented in the perpendicular direction compared to the direction of the additional layer 206. The electronic cell architecture of FIG. 2B allows to integrate a resistor 202 into an OTS device with no area penalty at the cost of one not critical additional mask and few additional process steps.

In both views of FIGS. 2A and 2B, the interconnection (not shown) of the portion 2020 of the resistors 202 is perpendicular to the interconnection of the additional layers 206. In other words, if the additional layer 206 is organized in columns, the bottom electrode is organized in rows.

In FIGS. 2A and 2B, the vertical portion 2022 of the resistor 202 is preferably centered with respect to the electronic cell 200 and extends vertically along the direction X. Alternatively, the vertical portion 2022 of the resistor 202 is preferably centered with respect to the electronic cell 200 and extends vertically along the direction Y.

The first electrode 205 and the resistor 202 are, for example, made of the same metallic materials, e.g., tungsten. Alternatively, the first electrode 205 and the resistor 202 can be made of two different metallic materials. For example, the resistor and/or the first electrode is/are made of a (refractory) metallic material, preferably selected in the group: carbon (C), carbon nitride ((CN) n), titanium (Ti), titanium nitride (TiN), titanium silicon nitride (TiSiN), tungsten (W), tungsten nitride ($W_2N$, WN, $WN_2$), tungsten carbon nitride, tungsten silicon nitride, tantalum (Ta), tantalum nitride (TaN), tantalum silicon nitride, tantalum tungsten, or any combination or alloy of these materials.

The first electrode 205 is connected to the additional layer 206. The first electrode 205 and the additional layer 206 are, for example, in direct contact. The additional layer 206 is, for example, connected to the first electrode 205 through a conductive via smaller than the first electrode 205 and made, for example, of tungsten.

The additional layer 206 has, for example, the same width as, or a larger width than, one of the dimensions of the first electrode 205.

The additional layer 206 is, for example, made of copper.

The OTS layer 204 has the property to have a significant decrease of resistivity when the voltage applied between the additional layer 206 and the resistor 202 exceeds a threshold voltage $V_{TH}$. This decrease (or increase) triggered by the voltage which is applied between the top and the bottom of the layer allows to consider the layer as forming a switch between an "off" state and an "on" state. If the voltage applied to OTS layer 204 is lower than the threshold $V_{TH}$ of the OTS layer 204, then the OTS layer 204 remains in the "off" or highly resistive state. In such a state, only a leakage current flows through the electronic cell 200. If a voltage higher than the threshold $V_{TH}$ is applied, then the OTS layer 204 switches to the "on" state and operates in a relatively low resistive state. In the "on" state, a current flow through the electronic cell 200. The threshold voltage $V_{TH}$ of the OTS layer 204 is, for example, inclusively between 0.5 V to 5 V.

The OTS layer 204 is, for example, made a chalcogenide material, e.g., germanium. Alternatively, the OTS layer is made of any other chalcogenide material, for example selected in the following group: germanium (Ge), tellurium (Te), selenium (Se), arsenic (As) or any combination or alloy of these materials. The OTS layer may for example also be doped, preferably with antimony (Sb), indium (In) or silicon (Si).

Further examples of ovonic materials adapted to form OTS layer 204 can be found in U.S. Pat. No. 8,148,707 (corresponding to European Patent No. 2204851), the content of which is hereby incorporated by reference to the extent authorized by law.

Typically, the chalcogenide material of the OTS layer is not a phase-change-material, i.e., the OTS layer is made of an amorphous material independently by the application of energy. In other words, a chalcogenide material is always an amorphous material. This means that the intermediate layer 204' is free of any phase change material.

The OTS layer 204 has, for example, a thickness of 30 nm. More in general, the OTS layer can have a thickness greater than or equal to 10 nm, more preferably greater than or equal to 15 nm, even more preferably greater than or equal to 25 nm, and/or less than or equal to 100 nm, more preferably less than or equal to 50 nm, even more preferably less than or equal to 40 nm.

The OTS layer 204 and the first electrode 205 of each electronic cell are separated from respective OTS layers 204 and first electrodes 205 of the adjacent cells by an insulating layer, not shown. In other words, the OTS layer 204 is "fully confined". The OTS layer 204 and the first electrode 205 have, for example, a parallelepipedal shape having, for example, for both layers the same width and the same length.

Figure 3:
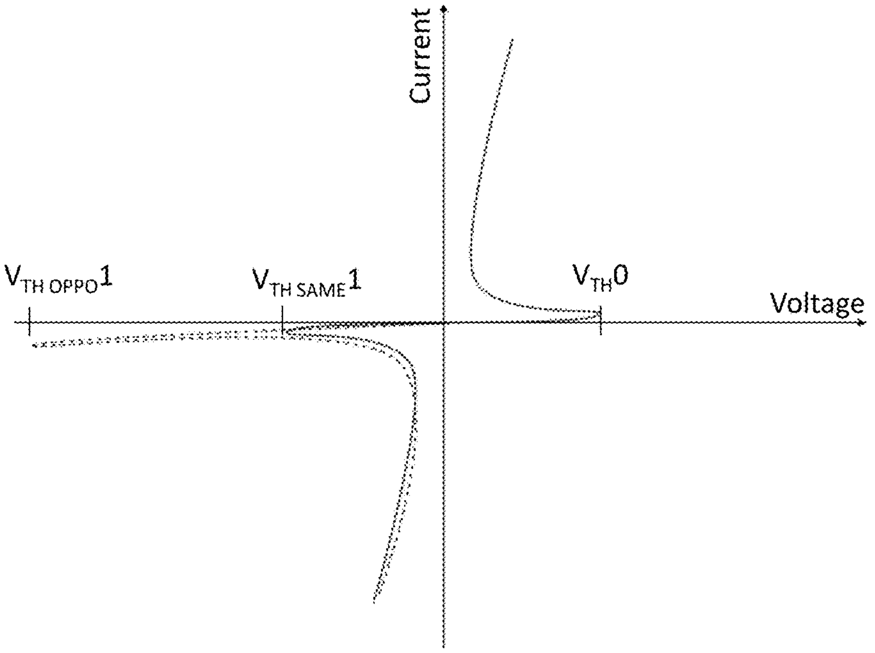
FIG. 3 illustrates a voltage-current characteristic of the electronic cell of FIGS. 2A and 2B.

FIG. 3 is a graph illustrating the evolution of the current as a function of the voltage applied to the electrodes of the electronic cell 200.

In a dual polarity operation, when the voltage applied to the electronic cell exceeds a first threshold voltage $V_{TH}$0 in a positive polarity or first polarity, the OTS layer 204 becomes conductive on an "on" state and is programmed as a "0" state or in a first logic state and then becomes resistive again on an "off" state as the applied voltage decreases. Similarly, when the voltage applied to the electronic cell exceeds in absolute value a threshold voltage $V_{TH}$1 in a negative polarity or second polarity, the OTS layer 204 becomes conductive on an "on" state and is programmed as a "1" state or in a second logic state and then it becomes restive again on an "off" state with the decrease of the applied voltage.

When an electronic cell is programmed twice in a row (twice consecutively) as a "1", the threshold voltage $V_{TH}$1 is less important in absolute value, than when an electronic cell is programmed as a "0" and then as a "1". In other words, if a same electronic cell was programmed as a "1" and then it is reprogrammed as a "1" (with no programming as a "0" in-between), the threshold voltage $V_{TH}$1 is equal to $V_{TH\ SAME}$ 1 while if a same electronic cell was programmed as a "0" and then it is programmed as a "1", the threshold voltage $V_{TH}$1 is equal to $V_{TH\ OPPO}$1 which is greater, in absolute value than $V_{TH\ SAME}$1. As an example, the voltage $V_{TH\ SAME}$1 is approximately equal, in absolute value, to the voltage $V_{TH}$0.

To take advantage of this memory effect, it is proposed to read the electronic cells 200, during a reading phase, with a voltage $V_{READ}$ which corresponds to a negative voltage whose value is comprised between $V_{TH\ SAME}$1 and $V_{TH\ OPPO}$1. With such a read voltage, if the measurement of the current flowing in the electronic cell determines that the OTS layer 204 is conductive, it is because the threshold voltage $V_{TH}$1 corresponded to $V_{TH\ SAME}$1 which was exceeded and that the electronic cell had been programmed just before as a "1". Conversely, if the measurement of the current flowing in the electronic cell determines that the OTS layer 204 is resistive, this means that the threshold voltage $V_{TH}$1 corresponded to $V_{TH\ OPPO}$1 which was not exceeded and that the electronic cell had been programmed just before as a "0".

It should be noted that an electronic cell reading does not overwrite the programming since reading a programming as a "1" consists in reprogramming as a "1" and reading a programming as a "0" consists in not reprogramming the electronic cell.

Figure 4:
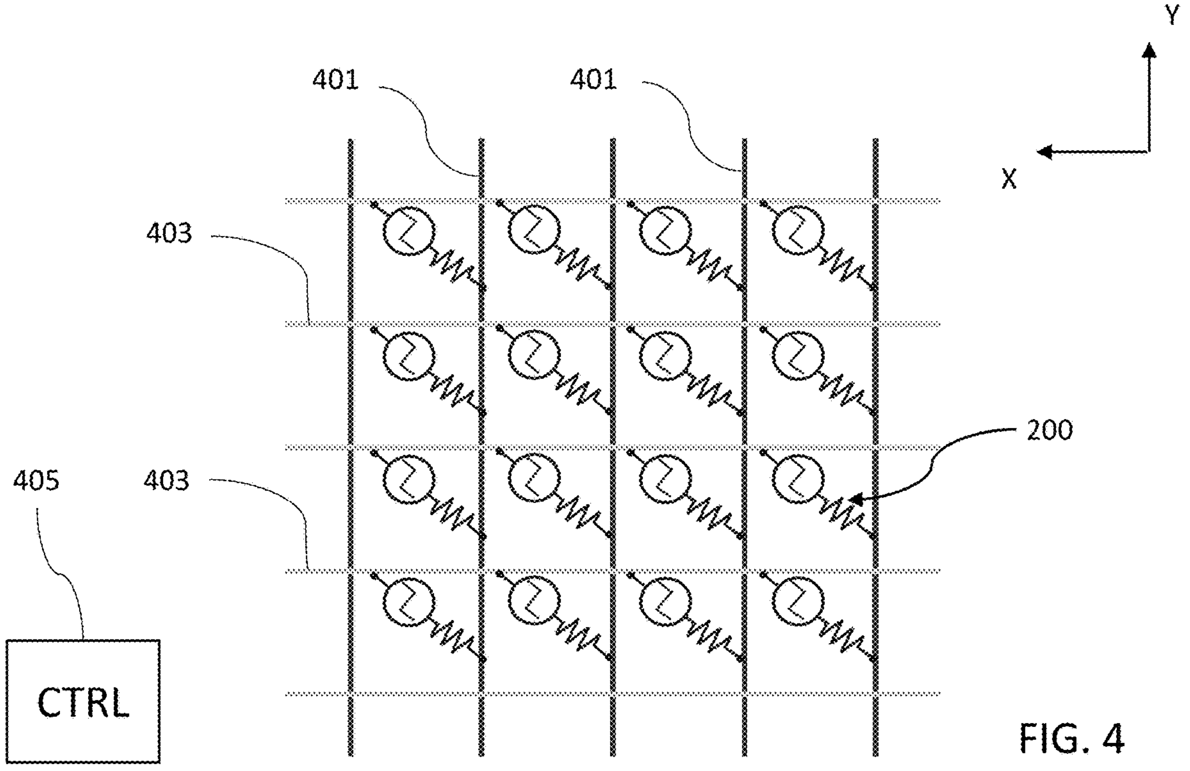
FIG. 4 illustrates a simplified schematic view of a memory circuit according to a first embodiment of the present embodiment.

FIG. 4 illustrates a simplified schematic view of an array of electronic cell 200.

The array of cells 200 exemplarily comprises a plurality of electronic cells 200 as illustrated in FIGS. 2A and 2B. The array is for example associated with a control circuit 405 (CTRL) configured to apply, on each electronic cell, a voltage between the two electrodes and more precisely between the resistor 202 and the first electrode 205.

The electronic cells 200 are, in FIG. 4, positioned between a plurality of bit lines 401 and word lines 403. In FIG. 4, bit lines 401 are illustrated with verticals lines and word lines 403 are illustrated with horizontal lines.

Exemplarily, the control circuit 405 comprises (not shown) for each pair of bit line 401 and word line 403 a respective inverter (i.e., one inverter connected to the bit line of the pair and one further inverter connected to the word line of the pair). Preferably each inverter comprises a respective p-MOS transistor and a respective n-MOS transistor. In this way the control circuit is structurally simple and/or has relatively high performances.

Preferably the control circuit 405 (also with reference to FIG. 6 as will be disclosed below) is structured and configured to apply, between the first electrode and the resistor, a read voltage impulse (of the first or the second polarity) having a voltage value between the first and second voltage threshold to determine a current logic state of the electronic cell.

Exemplarily, each electronic cell 200 is connected to the respective word line 403 by the first electrode 205 and to the respective bit line 401 by the resistor 202. Alternatively, the at least one electronic cell is connected to the respective bit line by its first electrode and to the respective word line by its resistor. The described connection is known as "crossbar scheme". It is noted that the electronic cell of the embodiments in a crossbar scheme allows to have the selector element out of the silicon substrate, allowing to advantageously introduce additional circuitry and/or logic components in the silicon substrate. Moreover, the crossbar scheme allows to improve the modularity of the memory circuit, with advantages for embedded applications (e.g., automotive).

To be programmed, an electronic cell 200 must see a voltage difference between its two electrodes connected respectively to the bit line 401 and the word line 403. Indeed, for the programming of an electronic cell 200 as a "0", its bit line 401 is put at a voltage corresponding to a value of −V/2 and its word line 403 is put at a voltage corresponding to a value of +V/2 so that the electronic cell considered sees a voltage of V. Similarly, for the programming of an electronic cell 200 as a "1", its bit line 401 is put at a voltage corresponding to a value of +V/2 and the word line 403 is put at a voltage corresponding to a value of −V/2 so that the electronic cell considered sees a voltage of −V.

For one or the other of the programs, the other electronic cells see a voltage of 0, V/2 or −V/2. By choosing the value of V so that its absolute value is greater than $V_{TH\ OPPO}$1 and the absolute value of V/2 is less than $V_{TH\ SAME}$1 and $V_{TH}$0, the electronic cells that see 0, V/2 or −V/2 are not programmed.

As an example, the operating voltage is comprised between 4 V and 6 V.

Figure 5:
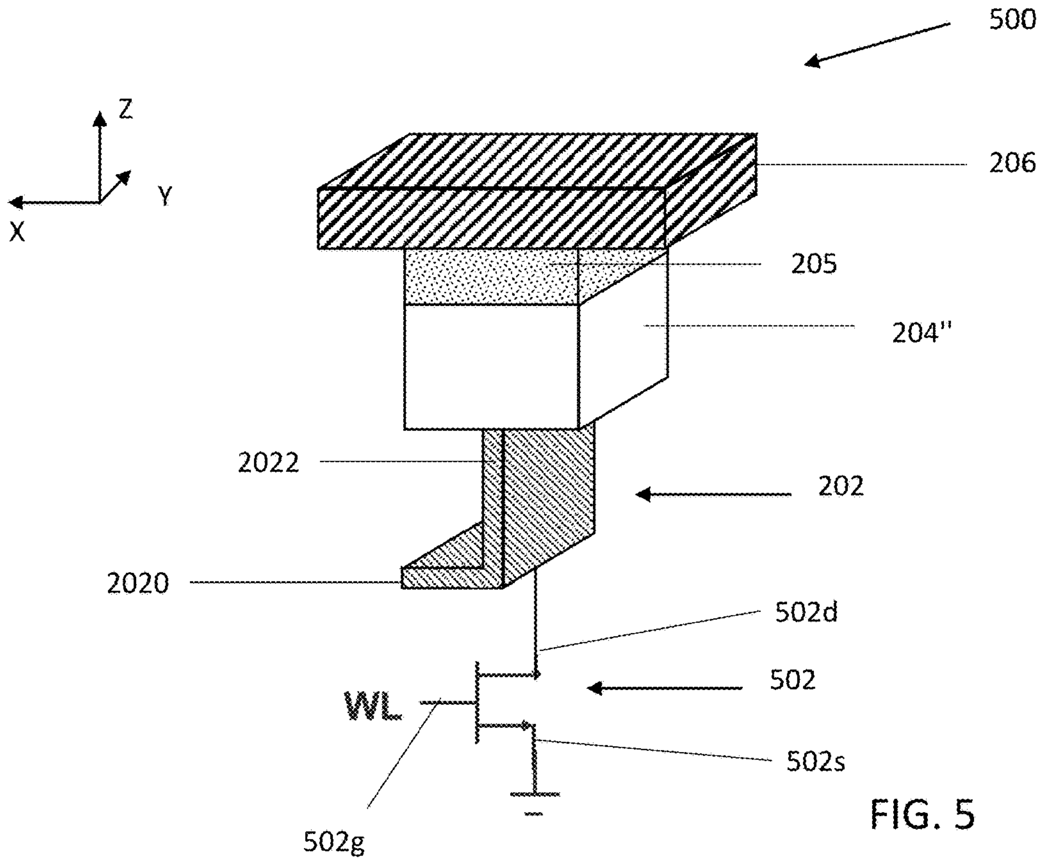
FIG. 5 illustrates a simplified cross-section view of an electronic cell according to a second embodiment.

FIG. 5 illustrates a simplified cross-section view of an electronic cell 500 according to a second embodiment.

The electronic cell 500 illustrated in FIG. 5 is similar to the electronic cell 200 illustrated in FIGS. 2A and 2B with the difference that the electronic cell 500 further comprises a transistor 502. Exemplarily, the transistor 502 is connected to the resistor 202 on opposite side with respect to the intermediate layer 204'. In this way it is possible to reduce the operating voltage of the overall electronic cell with advantages in terms of power consumption. Moreover, the transistor can act as selector element, thus allowing the OTS layer to only perform the memory function. In this way it is possible to use an OTS layer with relatively low thickness.

Alternatively, the transistor may be connected to the first electrode on opposite side with respect to the intermediate layer.

Exemplarily, the transistor 502 is a n-MOS FinFET transistor. It is verified that a n-MOS FinFET transistor can be easily driven, thus simplifying the overall operation of the memory circuit. In general, the transistor 502 is a MOSFET transistor, preferably of the FinFET type. It is verified that the MOSFET transistor (especially a FinFET transistor) has high performances in terms of low dimensions (i.e., low encumbrances of the electronic cell) and/or high frequency range. This favors the use of the electronic cell for embedded applications, e.g., for automotive applications.

Exemplarily, in the electronic cell 500, the OTS layer 204" has a thickness of 8 nm.

More in general, when the electronic cell comprises the transistor, the OTS layer 204" can have a thickness greater than or equal to 2 nm, preferably greater than or equal to 5 nm, and/or less than or equal to 15 nm, preferably less than or equal to 10 nm. As said above, the transistor allows the use of OTS layers of relatively low thickness, thus increasing the range of applicability of the memory circuit due to its easier integrability in a high variety of devices.

Figure 6:
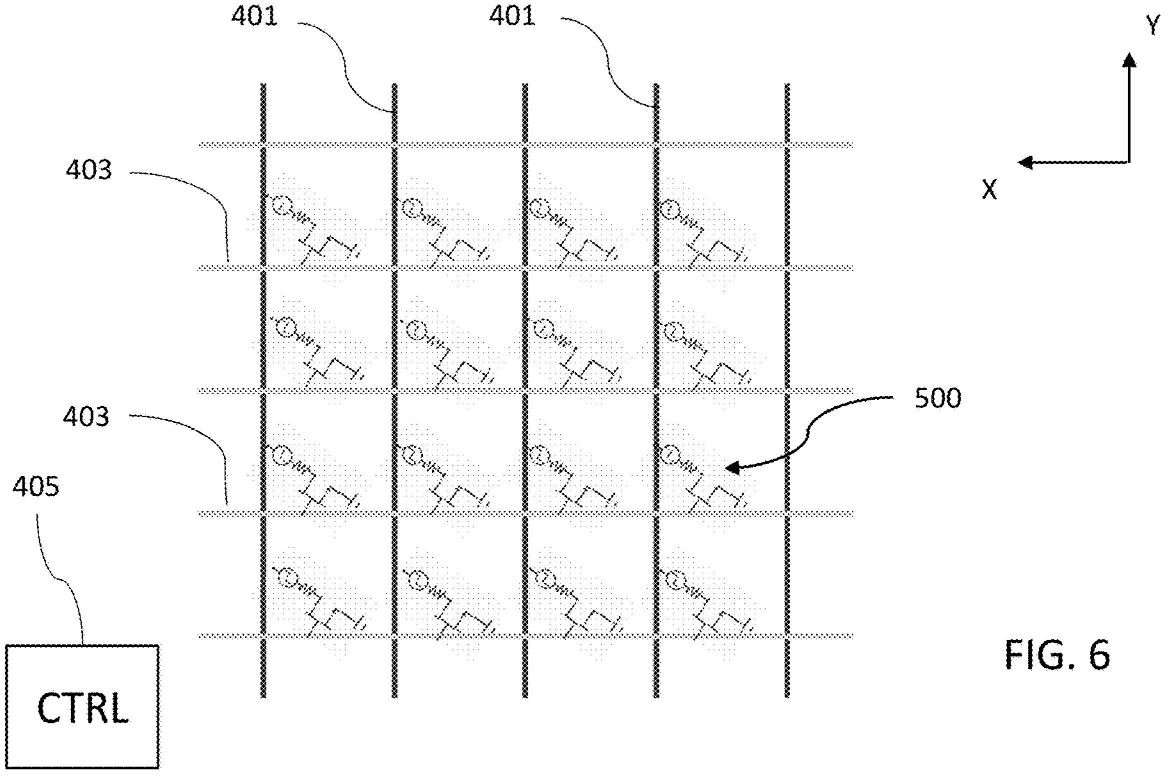
FIG. 6 illustrates a simplified schematic view of a memory circuit according to a second embodiment of the present embodiment.

As can be schematically seen in FIG. 6, the transistor 502 is connected by its gate 502*g* to a word line (WL).

In this example, the transistor 502 has its drain 502*d* connected to the resistor 202 and more specifically connected to the horizontal part 2020 of the resistor 202. In this example, the transistor 502 has its source 502*s* connected to mass.

FIG. 6 illustrates a simplified schematic view of an array of electronic cells 500 (with a plurality of electronic cells 500).

The electronic cells 500 are, in FIG. 6, positioned between a plurality of bit lines 401 and word lines 403.

Exemplarily, each electronic cell 500 is connected to a bit line 401, by its first electrode 205 and is connected to a word line 403 by the gate 502*g* of its transistor 502.

The memory array is for example associated with the control circuit 405.

To be programmed, the electronic cell 500 must have a non-zero voltage across it. For the programming of the electronic cell 500 as a "0", its bit line 401 is put at a voltage corresponding to a value of +V and its word line 403 is put at a voltage exemplarily corresponding to a value of 0 V so that the transistor 502 turned on and the electronic cell considered sees a voltage of V. For the programming of the electronic cell 500 as a "1", its bit line 401 is put at a voltage corresponding to a value of −V and its word line 403 is put at a voltage corresponding to a value exemplarily of 0 V so that the transistor 502 turned on and the electronic cell considered sees a voltage of −V.

For one or the other of the programs, the other electronic cells of the memory circuit have either their respective transistors 502 on and seeing a voltage of exemplarily 0 V, or they have their transistor 502 off. These electronic cells are therefore not programmed.

In one embodiment the control circuit comprises for each pair of bit line 401 and word line 403 a respective inverter (i.e., one inverter connected to the bit line of the pair and one further inverter connected to the word line of the pair), for example comprising a p-MOS transistor and n-MOS transistor.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A memory circuit, comprising:

a memory array comprising a plurality of electronic cells, wherein at least one electronic cell comprises an integrated stack having successively:

i) a first electrode;

ii) an intermediate layer consisting solely of an ovonic threshold switching layer; and iii) a resistor;

wherein the ovonic threshold switching layer is in direct contact with the first electrode and is in direct contact with the resistor;

wherein the memory array further includes a word line and a bit line, wherein one of the word line and bit line is connected to the first electrode and the other of the word line and bit line is connected to the resistor; and a control circuit connected to the at least one electronic cell through the word line and bit line, wherein the control circuit is configured to apply, between the first electrode and the resistor, a first voltage impulse of a first polarity to program the ovonic threshold switching layer of the electronic cell in a first logic state and apply a second voltage impulse of a second polarity, opposite the first polarity, to program the ovonic threshold switching layer of the electronic cell in a second logic state, different from the first logic state.

2. The memory circuit according to claim 1, wherein the ovonic threshold switching layer is made of a chalcogenide material.

3. The memory circuit according to claim 1, wherein the ovonic threshold switching layer has a thickness between 15 nm and 50 nm.

4. The memory circuit according to claim 1, wherein the bit line is connected to the resistor, and wherein the word line is connected to the first electrode.

5. The memory circuit according to claim 1, wherein the bit-line is connected to the first electrode of the at least one electronic cell, and wherein the word-line is connected to the resistor of the at least one electronic cell.

6. The memory circuit of claim 1, wherein the resistor has a horizontal portion and a vertical portion, wherein the vertical portion is interposed between the intermediate layer and the horizontal portion.

7. The memory circuit of claim 1, further comprising an additional layer connected to the first electrode on opposite side with respect to the intermediate layer.

8. The memory circuit of claim 7, wherein the additional layer is made of a material with a conductivity greater than or equal to 20 S/μm.

9. A memory circuit, comprising:

a memory array comprising a plurality of electronic cells, wherein at least one electronic cell comprises an integrated stack having successively:

i) a first electrode;

ii) an intermediate layer consisting solely of an ovonic threshold switching layer; and iii) a resistor;

wherein the ovonic threshold switching layer is in direct contact with the first electrode and is in direct contact with the resistor; and a transistor connected to the resistor on an opposite side with respect to the intermediate layer;

wherein the memory array further includes a word line and a bit line, wherein one of the word line and bit line is connected to the first electrode and the other of the word line and bit line is connected to the transistor; and a control circuit connected to the at least one electronic cell through the word line and bit line, wherein the control circuit is configured to apply, between the first electrode and the resistor, a first voltage impulse of a first polarity to program the ovonic threshold switching layer of the electronic cell in a first logic state and apply a second voltage impulse of a second polarity, opposite the first polarity, to program the ovonic threshold switching layer of the electronic cell in set a second logic state, different from the first logic state.

10. The memory circuit according to claim 9, wherein the transistor is a MOSFET transistor.

11. The memory circuit according to claim 9, wherein the transistor is a FinFET transistor.

12. The memory circuit according to claim 9, wherein the ovonic threshold switching layer has a thickness between 5 nm and 10 nm.

13. The memory circuit according to claim 9, wherein the word line is connected to the transistor and wherein the bit line is connected to the first electrode.

14. The memory circuit according to claim 9, wherein the transistor comprises a drain and a gate and wherein the drain is connected to the resistor, and wherein the gate is connected to the word line.

15. The memory circuit according to claim 9, wherein the word line is connected to the first electrode of the at least one electronic cell and wherein the bit line is connected to the transistor of the at least one electronic cell.

16. The memory circuit of claim 9, further comprising an additional layer connected to the first electrode on opposite side with respect to the intermediate layer, wherein the additional layer is made of a material with a conductivity greater than or equal to 20 S/μm.

17. A circuit, comprising:

an ovonic threshold switching memory cell formed by an integrated stack consisting of a first electrode, a resistor, and an ovonic threshold switching layer having a first surface in direct contact with the first electrode and a second surface in direct contact with the resistor;

a word line and a bit line, wherein one of the word line and bit line is connected to the first electrode and the other of the word line and bit line is connected to the transistor; and a control circuit electrically connected to the ovonic threshold switching memory cell and configured to program the ovonic threshold switching layer to set a first logic state by applying, between the first electrode and the resistor, a first voltage impulse of a first polarity and to program the ovonic threshold switching layer to a second logic state, different than the first logic state, by applying, between the first electrode and the resistor, a second voltage impulse of a second polarity opposite the first polarity.

18. The circuit according to claim 17, wherein the ovonic threshold switching layer is made of a chalcogenide material.

19. The circuit according to claim 17, wherein the ovonic threshold switching layer has a thickness between 15 nm and 50 nm.

* * * * *